United States Patent
Monthie et al.

(10) Patent No.: US 9,032,356 B2
(45) Date of Patent: May 12, 2015

(54) PROGRAMMABLE CLOCK SPREADING

(71) Applicant: LSI Corporation, San Jose, CA (US)

(72) Inventors: James G. Monthie, Fulton, MD (US);
Vineet Sreekumar, Mumbai (IN);
Ranjit Yashwante, Pune (IN)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/901,738

(22) Filed: May 24, 2013

(65) Prior Publication Data

US 2014/0253203 A1    Sep. 11, 2014

(30) Foreign Application Priority Data

Mar. 6, 2013  (IN) .......................... 685/MUM/2013

(51) Int. Cl.
G06F 9/455    (2006.01)
G06F 17/50   (2006.01)
H03K 5/135   (2006.01)

(52) U.S. Cl.
CPC ...................................... *H03K 5/135* (2013.01)

(58) Field of Classification Search
USPC .......................... 716/106, 108, 109, 133, 134
See application file for complete search history.

(56) References Cited

U.S. PATENT DOCUMENTS

| | | | |
|---|---|---|---|
| 5,257,223 A | 10/1993 | Dervisoglu | |
| 7,159,200 B2* | 1/2007 | Yoneda | 716/113 |
| 7,284,143 B2 | 10/2007 | Song et al. | |
| 7,464,286 B1* | 12/2008 | Singh et al. | 713/503 |
| 7,868,679 B2 | 1/2011 | Riedel et al. | |
| 7,895,488 B1 | 2/2011 | Bertanzetti | |
| 7,944,241 B1 | 5/2011 | Sharma et al. | |
| 7,954,000 B2 | 5/2011 | Allen et al. | |
| 8,584,067 B2* | 11/2013 | Osborn et al. | 716/113 |
| 8,627,160 B2* | 1/2014 | Devta-Prasanna et al. | 714/726 |
| 2003/0154455 A1 | 8/2003 | Yoshida | |
| 2004/0104857 A1* | 6/2004 | Kaindl | 343/703 |
| 2004/0187058 A1 | 9/2004 | Yamada et al. | |

(Continued)

FOREIGN PATENT DOCUMENTS

EP    1643257 A1    4/2006
TW    200624833    7/2006

(Continued)

OTHER PUBLICATIONS

Gonzalez, D., et al., "Improved Clock Distribution Strategy for RNS-based DSP VLSI Systems", Proc. of XVIII Conference on Design of Circuits and Integrated Systems (DCIS'2003) Nov. 2003, pp. 256-260.

(Continued)

*Primary Examiner* — Brian Ngo

(74) *Attorney, Agent, or Firm* — Daniel J. Santos; Smith Risley Tempel Santos LLC

(57) ABSTRACT

An integrated circuit having a programmable clock spreader configured to generate a plurality of controllably skewed clock signals, each applied to a corresponding region within the integrated circuit with circuitry configured to be triggered off the applied clock signal. The programmable clock spreader is designed to enable customization of the current-demand characteristics exhibited by the integrated circuit, e.g., based on the circuit's spectral impedance profile, to cause transient voltage droops in the power-supply network of the integrated circuit to be sufficiently small to ensure proper and reliable operation of the integrated circuit.

20 Claims, 4 Drawing Sheets

(56) References Cited

U.S. PATENT DOCUMENTS

| | | |
|---|---|---|
| 2005/0055614 A1 | 3/2005 | Yeh |
| 2005/0071707 A1 | 3/2005 | Hampel |
| 2006/0129961 A1* | 6/2006 | Paul et al. .................. 716/6 |
| 2009/0119552 A1* | 5/2009 | Chelstrom et al. ............ 714/55 |
| 2012/0060136 A1* | 3/2012 | Suzuki ..................... 716/114 |
| 2012/0119805 A1* | 5/2012 | John et al. ................. 327/161 |
| 2013/0055186 A1* | 2/2013 | Walker et al. .............. 716/122 |

FOREIGN PATENT DOCUMENTS

| | | |
|---|---|---|
| TW | 200819769 A | 5/2008 |
| WO | WO2008108902 A1 | 9/2008 |

OTHER PUBLICATIONS

"Spread Spectrum Clock Generation Technology", Lexmark International, Inc., 2003; pp. 1-2.

Regan, T., et al., "Easy-to-use spread spectrum clock generator reduces EMI and more", Linear Technol. Mag., 2004, pp. 6-12.

Gonzalez, D., et al., "Efficient Clock Distribution Scheme for VLSI RNS-Enabled Controllers", Power and Timing Modeling, Optimization and Simulation Lecture Notes in Computer Science, vol. 3728, 2005, pp. 657-665.

Almukhaizim, S., et al., "Dynamic Scan Chain Partitioning for Reducing Peak Shift Power During Test," IEEE Transactions on Computer-Aided Design of Integrated Circuits and Systems, Feb. 2009, vol. 28, No. 2, pp. 298-302.

"Timing-Safe Spread Spectrum EMI Reduction", AND8443/D, Dec. 2010, pp. 1-4.

Kaplan, Y., et al., "Post optimization of a clock tree for power supply noise reduction," 2012 IEEE 27th Convention of Electrical & Electronics Engineers in Israel (IEEEI), pp. 1,5, Nov. 14-15, 2012.

Rice, J., et al., "Understanding Noise-Spreading Techniques and Their Effects in Switch-Mode Power Applications", Topic 2, 2011, pp. 2-1-2-26.

Taiwan Office Action; Mailed Jun. 11, 2013 for corresponding TW Application No. 099129505.

* cited by examiner

100

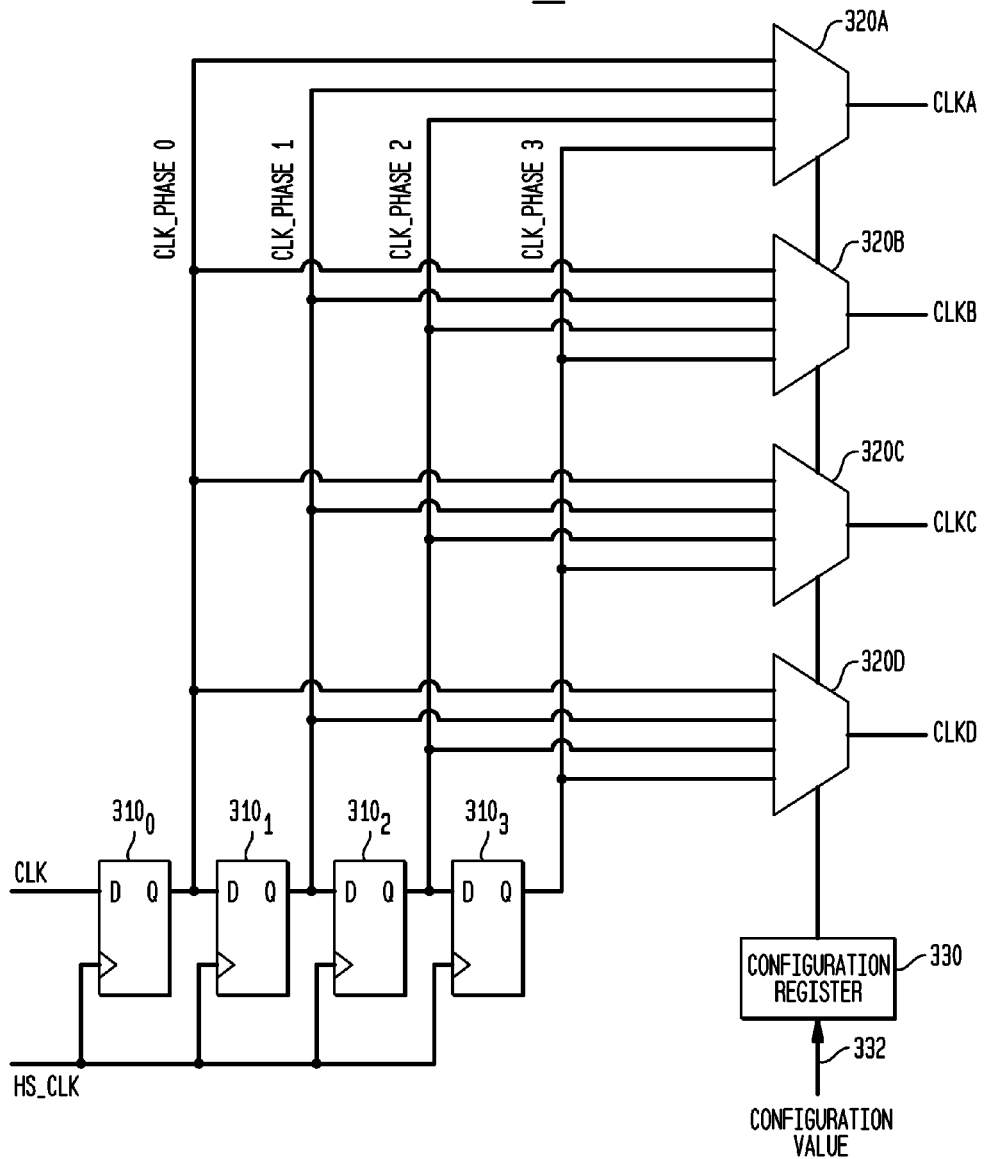

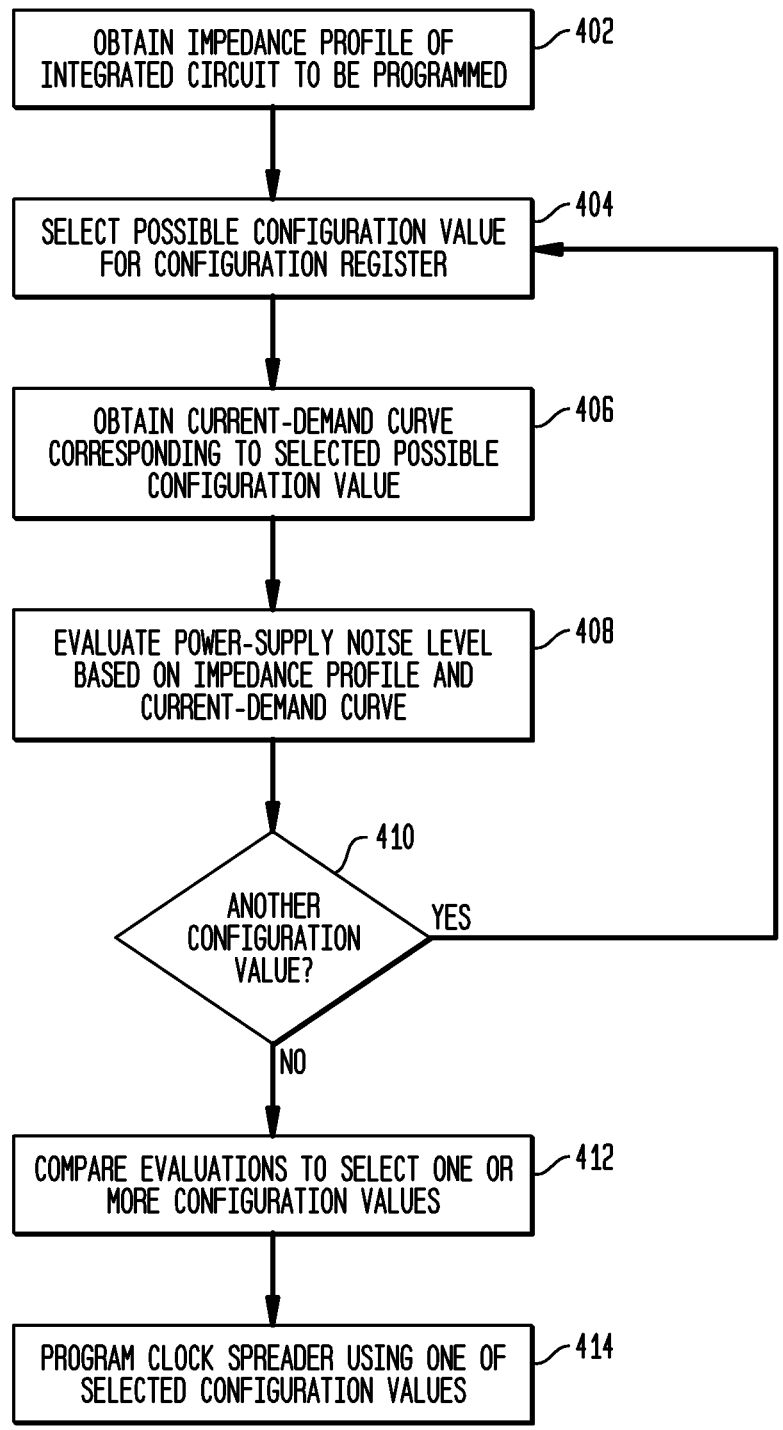

PROGRAMMABLE CLOCK SPREADING

FIELD

The present disclosure relates generally to integrated circuits and, more specifically but not exclusively, to power-supply noise reduction techniques.

BACKGROUND

In a synchronous integrated circuit, substantially simultaneous triggering of many circuit elements leads to short duration but large amplitude current demands concentrated around the active clock edges. The relatively high current peaks typically cause transient power-supply voltage droops in various parts of the circuit. These transient voltage droops (also sometimes referred to as power-supply noise) are a major concern, for example, because, for a power-supply voltage of about 1 V, a power-supply noise level on the order of about 100 mV might cause the integrated circuit to malfunction.

SUMMARY

Disclosed herein are various embodiments of an integrated circuit having a programmable clock spreader configured to generate a plurality of controllably skewed clock signals, each applied to a corresponding region within the integrated circuit with circuitry configured to be triggered off the applied clock signal. The programmable clock spreader is designed to enable customization of the current-demand characteristics exhibited by the integrated circuit, e.g., based on the circuit's spectral impedance profile, to cause transient voltage droops in the power-supply network of the integrated circuit to be sufficiently small to ensure proper and reliable operation of the integrated circuit.

Also disclosed herein are various embodiments of a method of clock spreading that uses the circuit's spectral impedance profile to identify a configuration of the programmable clock spreader that enables the integrated circuit to attain desired current-demand characteristics.

Some embodiments are directed to a non-transitory machine-readable medium, having encoded thereon program code, wherein, when the program code is executed by a machine, the machine performs the above-mentioned method of clock spreading.

BRIEF DESCRIPTION OF THE FIGURES

Other embodiments of the disclosure will become more fully apparent from the following detailed description and the accompanying drawings, in which:

FIG. 3 shows a block diagram of a programmable clock spreader that can be used in the integrated circuit of FIG. 1 according to an embodiment of the disclosure; and FIG. 4 shows a flowchart of a method of programming an integrated circuit analogous to the integrated circuit shown in FIG. 1 to perform clock spreading according to an embodiment of the disclosure.

DETAILED DESCRIPTION

Figure 1:
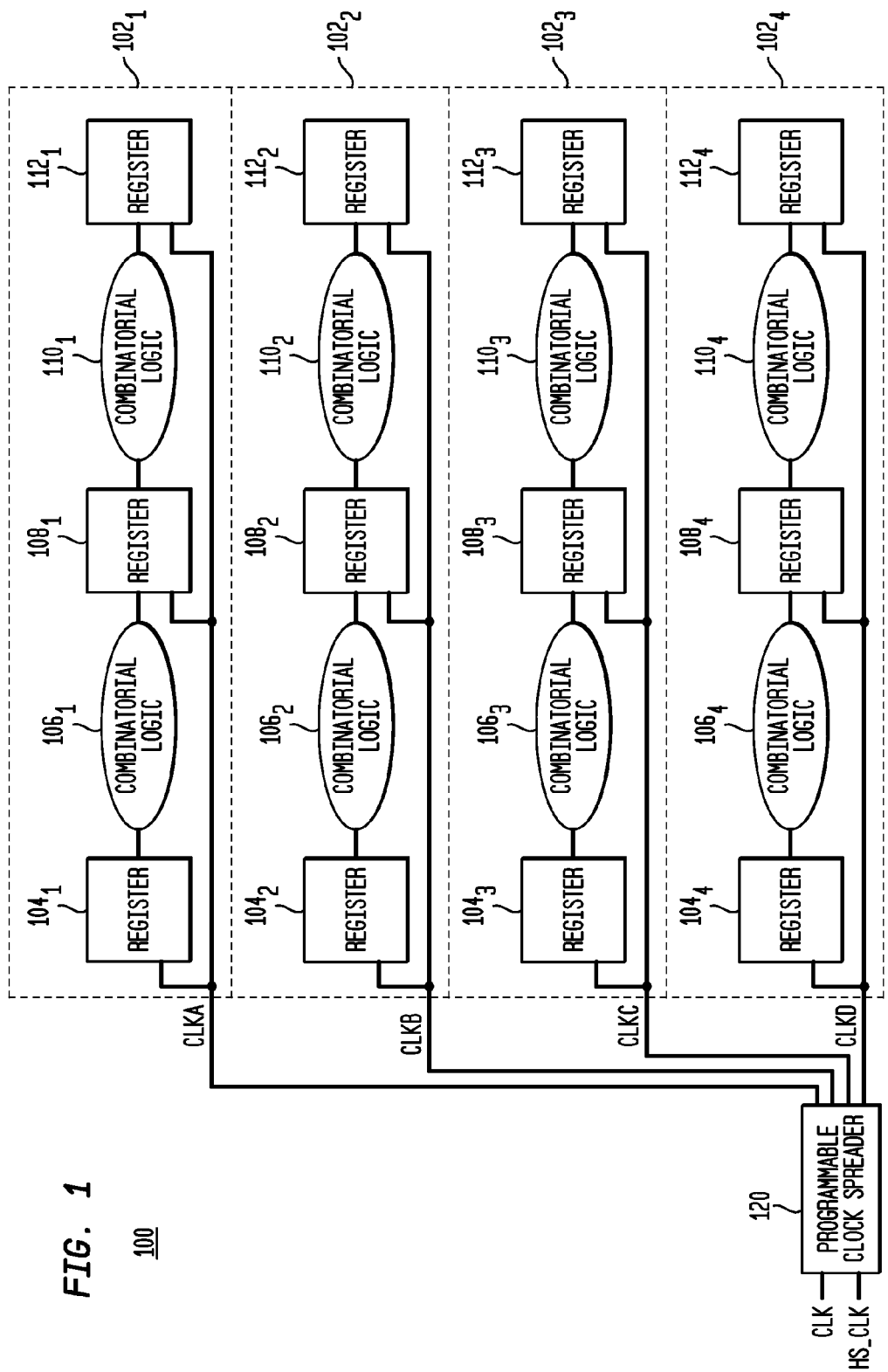
FIG. 1 shows a block diagram of an integrated circuit according to an embodiment of the disclosure.

As indicated above, conventional, low-skew clock-tree designs may disadvantageously lead to relatively large current spikes in the power-supply network of an integrated circuit (chip) over relatively short time periods. Various embodiments disclosed herein are generally directed at reducing these current spikes, as well as fluctuations in instantaneous power consumption in the integrated circuit and the associated power-supply noise. Peak-current reduction is considered to be beneficial for one or more of the following exemplary reasons:

(1) it reduces the IR voltage drop within the circuit die, where the ohmic resistance (R) is a major impedance component;

(2) it reduces the inductive power-supply noise, $\sim L(dI/dt)$, at the circuit's package level, where inductance (L) is a significant impedance component;

(3) it reduces clock jitter because the clock jitter is generally directly related to the magnitude of the power-supply voltage droops; and (4) it reduces requirements to the capacitance of decoupling capacitors, which tends to reduce the cost of the integrated circuit.

Embodiments of the present disclosure tend to reduce power-supply noise using clock-skew engineering. More specifically, the integrated circuit has an architecture that enables it to reduce current spikes by providing, to different clock regions within the circuit, respective differently skewed clock signals, e.g., derived from the same (common) master clock. As used herein, the term "clock region" refers to a block of circuitry, such as a logic block, a processor core, a data path, a circuit island, a clock domain, or a sub-circuit, whose circuit elements are triggered off the same provided clock signal. In some embodiments, different clock regions may be configured to operate in parallel with one another or in quasi-independent manner. Division of the integrated circuit into clock regions may follow the natural functional and/or logical partitions dictated by the circuit design, function, and/or structure. For example, each of the clock regions may include a different respective data-path structure from one I/O (input/output) register to another I/O register.

To achieve desired circuit performance characteristics, the controllably introduced clock-skew amount for each clock region can be individually programmed, e.g., based on the frequency dependence of the circuit's impedance and on the exhibited power-supply noise frequencies. In one embodiment, the introduced clock-skew amounts for different clock regions can be selected from a set of values consisting of different integer multiples of the common skew increment. For example, the integer multiple corresponding to a clock region can be continuously programmable, e.g., from 0 (no skew) to N, where N is a predetermined positive integer.

In various alternative embodiments, various respective hardware features (such as clock inverters, clock-delay cells, positive and negative edge registers, high-speed clock sources, programmable fuses, signal selectors, etc.), provided on-chip, can be used to enable programmability of the clock skew for various clock regions. The clock-skew amounts can be (i) static, e.g., set once in hardware at the fabrication facility, (ii) adjusted dynamically, e.g., in real-time, based on the effective operating mode of the integrated circuit, or (iii) reprogrammed on demand, e.g., when the circuit configuration is changed by the user/customer. In embodiments that require signal crossing from one clock region to another clock region, signal-transfer paths between the corresponding clock regions can be engineered to ensure that no timing (e.g., late or early mode) violations occur after the clock-skew amounts have been programmed or reprogrammed.

FIG. 1 shows a block diagram of an integrated circuit 100 according to an embodiment of the disclosure. Circuit 100 is illustratively shown in FIG. 1 as having four clock regions, labeled $102_1$-$102_4$. However, one of ordinary skill in the art will understand that, in various alternative embodiments, circuit 100 can similarly be designed to have fewer or more than four clock regions.

Each clock region $102_i$ (i=1, 2, 3, 4) is illustratively shown in FIG. 1 as comprising clocked registers $104_i$, $108_i$, and $112_i$ and logic blocks $106_i$ and $110_i$. At least some of registers $104_i$, $108_i$, and $112_i$ can be configured to operate as input and/or output registers that receive signals from and/or output signals to external circuits (not explicitly shown in FIG. 1). In various alternative embodiments, different clock regions $102_i$ can be designed to (i) have other and/or additional circuit elements and/or (ii) be dissimilar to one another and include different respective sets of circuit elements.

Circuit 100 further comprises a programmable clock spreader 120 configured to apply different respective clock signals, labeled CLKA, CLKB, CLKC, and CLKD, to clock regions $102_1$-$102_4$, respectively. Clock spreader 120 generates clock signals CLKA, CLKB, CLKC, and CLKD based on a master-clock signal, labeled CLK, and a relatively high-speed clock signal, labeled HS_CLK. Depending on how clock spreader 120 is programmed, the clock spreader may generate clock signals CLKA, CLKB, CLKC, and CLKD so that (i) each of these four clock signals has a different respective (e.g., unique) programmed skew amount with respect to master-clock signal CLK or (ii) the programmed skew amounts for these four clock signals are selected from a set of clock-skew values consisting of fewer than four different values. In the latter case, at least two of clock signals CLKA, CLKB, CLKC, and CLKD will have the same programmed skew amount.

Figure 2A:
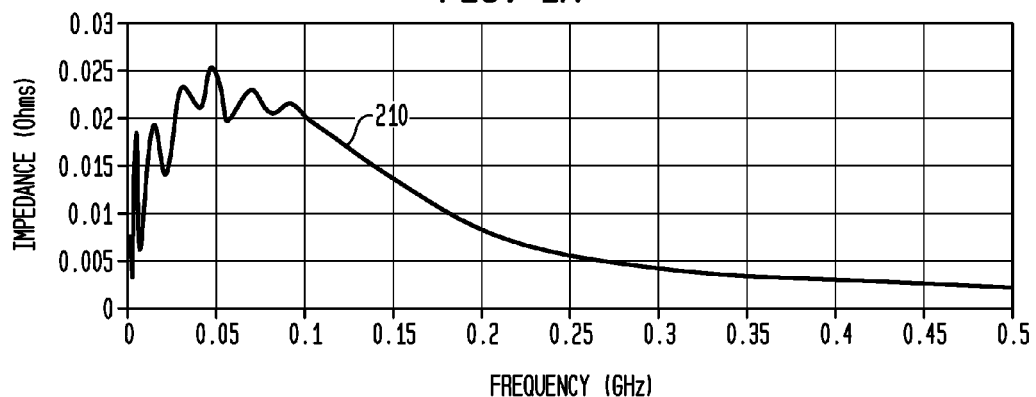
FIGS. 2A-2C graphically show certain characteristics of the integrated circuit shown in FIG. 1 according to an embodiment of the disclosure.
Figure 2B:
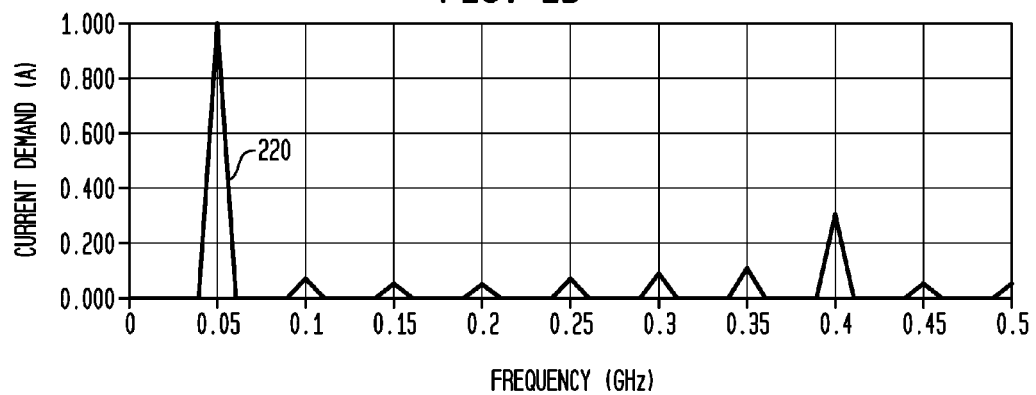
Figure 2C:
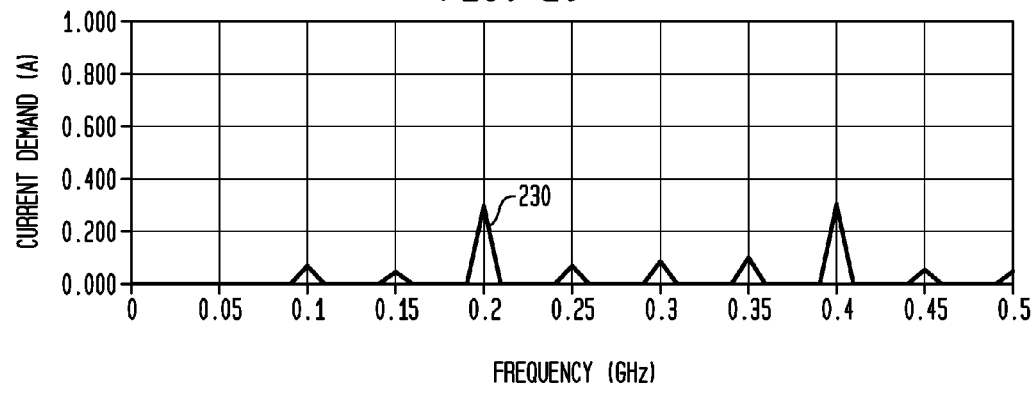

FIGS. 2A-2C graphically show certain characteristics of circuit 100 (FIG. 1) according to an embodiment of the disclosure. More specifically, FIG. 2A shows a spectral impedance profile 210 that demonstrates the frequency dependence of the impedance of circuit 100. The data shown in FIGS. 2B-2C correspond to an operating mode of circuit 100 in which master-clock signal CLK has a frequency of 50 MHz. The current-demand characteristic that is graphically depicted in FIG. 2B as a curve 220 demonstrates the frequency dependence of the current demand presented by circuit 100 to the power supply when clock spreader 120 is programmed to generate clock signals CLKA, CLKB, CLKC, and CLKD so that none of them is skewed with respect to master-clock signal CLK. This configuration of circuit 100 models the operation of a conventional integrated circuit that does not have multiple clock regions analogous to clock regions $102_1$-$102_4$ and, as such, lacks the capability to controllably skew the clock signals in a programmable manner. The current-demand characteristic that is graphically depicted in FIG. 2C as a curve 230 demonstrates the frequency dependence of the current demand presented by circuit 100 to the power supply when clock spreader 120 is programmed to generate clock signals CLKA, CLKB, CLKC, and CLKD so that: (i) clock signal CLKA is not skewed with respect to master-clock signal CLK; (ii) clock signal CLKB is skewed with respect to master-clock signal CLK by an amount approximately equal to one quarter of a clock cycle; (iii) clock signal CLKC is skewed with respect to master-clock signal CLK by an amount approximately equal to one half of a clock cycle; and (iv) clock signal CLKD is skewed with respect to master-clock signal CLK by an amount approximately equal to three quarters of a clock cycle.

Referring to FIG. 2A, spectral impedance profile 210 has a global maximum located at approximately 50 MHz. Spectral impedance profile 210 further has several local maxima located in the frequency range between approximately 5 MHz and approximately 90 MHz. The local maxima located next to each other are separated by a corresponding local minimum of spectral impedance profile 210. At frequencies higher than approximately 90 MHz, the circuit's impedance gradually decreases, with the frequency increase, down to about 10% of the maximum value.

Referring to FIG. 2B, current-demand curve 220 has its most-prominent (also sometimes referred to as the dominant) frequency band located at 50 MHz primarily because master-clock signal CLK has this frequency. The other frequency bands of current-demand curve 220 are the spectral harmonics of the master-clock frequency, with the eighth harmonic (located at approximately 400 MHz) being the second most-prominent frequency band. Note that the dominant frequency band of current-demand curve 220 lines up with a peak of spectral impedance profile 210 (FIG. 2A). This property is detrimental to the circuit's performance, e.g., because it can cause a relatively large transient power-supply voltage drop due to the fact that the voltage drop is approximately proportional to the product of the current and the impedance.

Referring to FIG. 2C, current-demand curve 230 has its dominant frequency band located at 200 MHz primarily because the current demand is now staggered over four different, equally spaced phases of master-clock signal CLK. The fundamental (50 MHz) master-clock frequency band is now substantially fully suppressed, while the other frequency bands of current-demand curve 230 are similar to the corresponding frequency bands of current-demand curve 220 (FIG. 2B). Note that, unlike the dominant frequency band of current-demand curve 220, which lines up with a peak in spectral impedance profile 210, the dominant frequency band of current-demand curve 230 corresponds to an impedance value that is only about 30% of the maximum impedance value in spectral impedance profile 210 (see FIG. 2A). The latter property results in an improvement in the circuit performance compared to the previous configuration, e.g., because the transient power-supply voltage drops are now significantly reduced due to both the lower instantaneous current-demand level and the lower effective circuit impedance.

In an alternative embodiment, the circuit configuration to be achieved by programming clock spreader 120 can be determined by measuring or simulating the spectral impedance profile (such as spectral impedance profile 210, FIG. 2A) of integrated circuit 100 and then choosing a configuration for the programmable clock spreader that causes the dominant frequency band of the current-demand curve (such as current-demand curve 230, FIG. 2C) exhibited by the integrated circuit during operation to be at a spectral location corresponding to either (i) a null or a minimum of the spectral impedance profile or (ii) an impedance value in the spectral impedance profile that does not exceed about 40% of the maximum impedance value in the spectral impedance profile. In some embodiments, it may be possible to choose a configuration that results in a spectral location of the dominant frequency band that is characterized by both (i) and (ii).

FIG. 3 shows a block diagram of a programmable clock spreader 300 that can be used as clock spreader 120 (FIG. 1) according to an embodiment of the disclosure. Clock spreader 300 is illustratively shown in FIG. 3 as being configured to: (i) receive master-clock signal CLK and high-speed clock signal HS_CLK and (ii) generate clock signals CLKA, CLKB, CLKC, and CLKD. In the embodiment of FIG. 3, high-speed clock signal HS_CLK has a frequency that is four times higher than the frequency of master-clock signal CLK. For example, if master clock signal CLK has a frequency of 50 MHz, then high-speed clock signal HS_CLK has a frequency of 200 MHz.

Clock spreader 300 includes a shift register having four D flip-flops $310_0$-$310_3$ serially connected to one another as indicated in FIG. 3. Each of D flip-flops $310_0$-$310_3$ is clocked by clock signal HS_CLK and, as such, operates to update its output signal, based on its input signal, four times per clock cycle of master-clock signal CLK. Master-clock signal CLK serves as the input signal for D flip-flop $310_0$. The output signal of D flip-flop $310_0$, labeled CLK_PHASE0, serves as the input signal for D flip-flop $310_1$. The output signal of D flip-flop $310_1$, labeled CLK_PHASE1, serves as the input signal for D flip-flop $310_2$. The output signal of D flip-flop $310_2$, labeled CLK_PHASE2, serves as the input signal for D flip-flop $310_3$. The output signal of D flip-flop $310_3$ is labeled CLK_PHASE3.

Each of signals CLK_PHASE0, CLK_PHASE1, CLK_PHASE2, and CLK_PHASE3 has the same frequency as master-clock signal CLK. However, the phases of signals CLK_PHASE0, CLK_PHASE1, CLK_PHASE2, and CLK_PHASE3 differ from one another. More specifically, signal CLK_PHASE1 is skewed with respect to signal CLK_PHASE0 by an amount approximately equal to one quarter of a clock cycle. Signal CLK_PHASE2 is skewed with respect to signal CLK_PHASE0 by an amount approximately equal to one half of a clock cycle. Signal CLK_PHASE3 is skewed with respect to signal CLK_PHASE0 by an amount approximately equal to three quarters of a clock cycle.

Clock spreader 300 further comprises four signal selectors 320A-320D. Each signal selector 320 is configured to (i) receive, as its inputs, signals CLK_PHASE0, CLK_PHASE1, CLK_PHASE2, and CLK_PHASE3 and (ii) select and transfer one of the received signals to the selector's output. A configuration register 330 operates to set the configuration of each of signal selectors 320A-320D, thereby controlling which of signals CLK_PHASE0, CLK_PHASE1, CLK_PHASE2, and CLK_PHASE3 is selected and transferred to the output in each of the signal selectors. The signal selected and transferred by signal selector 320A is output by clock spreader 300 as clock signal CLKA. The signal selected and transferred by signal selector 320B is output by clock spreader 300 as clock signal CLKB. The signal selected and transferred by signal selector 320C is output by clock spreader 300 as clock signal CLKC. The signal selected and transferred by signal selector 320D is output by clock spreader 300 as clock signal CLKD.

In one embodiment, configuration register 330 is an 8-bit register configured to be programmed, using a write signal 332, to store a desired configuration value that determines the configurations of signal selectors 320A-320D. For example, the first two bits of the configuration value stored in configuration register 330 determine which of signals CLK_PHASE0, CLK_PHASE1, CLK_PHASE2, and CLK_PHASE3 is transferred by signal selector 320A to serve as clock signal CLKA. The second two bits of the configuration value stored in configuration register 330 similarly determine which of signals CLK_PHASE0, CLK_PHASE1, CLK_PHASE2, and CLK_PHASE3 is transferred by signal selector 320B to serve as clock signal CLKB, etc.

Depending on the particular embodiment, configuration register 330 can be designed to be programmable using software, the circuit's firmware, or one or more on-chip fuses. In some embodiments, configuration register 330 can be designed to be one-time programmable, with the programming to be performed, e.g., at the fabrication facility. In some embodiments, configuration register 330 can be designed to be programmable multiple times so that it can be reprogrammed, as desired or necessary, by the customer or user in the field after the chip has been shipped out from the fabrication facility.

In an alternative embodiment, clock spreader 300 can be modified to have a shift register having an arbitrary (but practical from the engineering viewpoint) number K of serially connected flip-flops, where K is a positive integer greater than one. If $f_0$ is the frequency of master-clock signal CLK, then high-speed clock signal HS_CLK used in this alternative embodiment is generated to have a frequency of $Kf_0$. As a result, the K output signals generated by the K serially connected flip-flops represent, in this embodiment, K different, equally spaced phases of master-clock signal CLK.

Clock spreader 300 can further be modified to have an arbitrary number L ($1<L\leq K$) of signal selectors, each configured to receive some (e.g., a subset) or all of the K different phases of master-clock signal CLK generated by the K serially connected flip-flops. Note that the embodiment of clock spreader 300 shown in FIG. 3 corresponds to L=K=4. However, in an alternative embodiment, K can be greater than four. If L<K, then fewer than all K available phases of master-clock signal CLK will be used in the output signals (e.g., CLKA, CLKB, etc.) generated by the corresponding embodiment of clock spreader 300.

One of ordinary skill in the art will appreciate that, by changing the set of phases of master-clock signal CLK selected to serve as the output signals of clock spreader 300, one can controllably change the spectral content of the circuit's current-demand curve (such as current-demand curve 230 shown in FIG. 2C) in general and the spectral location of the curve's most-prominent frequency bands in particular. The latter feature of clock spreader 300 advantageously enables customization of the circuit's current-demand curve for any given circuit-impedance profile in a manner that causes the power-supply noise to be lower than a predetermined and/or acceptable threshold level.

In yet other alternative embodiments, various alternative circuit means (other than or in addition to the serially connected flip-flops and high-speed clock) can be used in clock spreader 300 to generate different desired phases of master-clock signal CLK. For example, for clock signals having a 50% duty cycle, a signal inverter can be used to generate an inverted clock signal, which is equivalent to the clock signal that is phase shifted by one half of the clock cycle. As another example, a delay cell can be used to generate a delayed signal, which is equivalent to the clock signal that is phase shifted by the fractional portion of the clock cycle corresponding to the delay time imparted on the clock signal by the delay cell. The use of other alternative circuit means is similarly contemplated. The generated phases of master-clock signal CLK do not have to be equidistant.

FIG. 4 shows a flowchart of a method 400 of programming an integrated circuit analogous to circuit 100 (FIG. 1) to perform clock spreading according to an embodiment of the disclosure. The provided description of method 400 assumes that the integrated circuit that is being programmed employs a programmable clock spreader that is similar to clock spreader 300 (FIG. 3) but has L signal selectors and is configured to generate K different phases of the master-clock signal, where L and K are positive integers greater than one, and $1<L\leq K$. In some embodiments, the entirety or some parts of method 400 can be implemented in the form of program code, for example, stored in a non-transitory machine-readable storage medium for being loaded into and/or executed by a machine, such as a computer, wherein, when the program code is loaded into and executed by the machine, the machine becomes an apparatus for practicing the method. In some other embodiments, method 400 can be adapted for use at a fabrication facility. In yet some other embodiments, method 400 can be adapted for use by a customer (to which circuit 100 is sold) and be performed outside the fabrication facility.

At step 402 of method 400, an appropriate procedure is carried out to obtain a spectral impedance profile of the integrated circuit that is to be programmed. The obtained spectral impedance profile might be similar to spectral impedance profile 210 shown in FIG. 2A. In one embodiment, the procedure employed at step 402 includes a computer-based circuit-performance simulation or model used in the design and development (e.g., pre-fabrication) stage of the circuit production. In an alternative embodiment, the procedure employed at step 402 includes a physical measurement (e.g., using a circuit tester) of the impedance of the power-delivery network of an actual chip. The chip under test can be a prototype or a final product.

At step 404, a possible configuration value is selected for the configuration register, such as configuration register 330 (FIG. 3). Any suitable selection criteria can be used in different embodiments of step 404. For example, in the first instance of step 404, all bits of the configuration value can be set to zero, which usually corresponds to a circuit configuration in which all clock regions receive the same (non-skewed) master-clock signal. Then, in each subsequent instance of step 404, the previously selected configuration value is incremented by a respective predetermined amount. Alternatively, an ordered list of possible configuration values of interest for this particular circuit can be compiled, e.g., based on the applicable design constraints and/or engineering considerations. Then, in each instance of step 404, a next respective entry from the list is selected, e.g., in the order of appearance in the list.

At step 406, another appropriate procedure is carried out to obtain a current-demand curve corresponding to the configuration value selected at step 404. The obtained current-demand curve might be similar to current-demand curve 220 shown in FIG. 2B or current-demand curve 230 shown in FIG. 2C. In one embodiment, the procedure employed at step 406 includes a computer-based circuit-performance simulation or model used in the design and development stage of the circuit production. In an alternative embodiment, the procedure employed at step 406 includes a physical measurement (e.g., using a circuit tester) of the supply-current waveforms in an actual chip. The measured waveforms are then subjected to a Fourier transform to obtain the corresponding current-demand curve.

At step 408, the power-supply noise level is evaluated, qualitatively and/or quantitatively, based on the spectral impedance profile obtained at step 402 and the current-demand curve obtained at step 406.

In one embodiment, a quantitative noise-level estimate is obtained using the steps of: (i) identifying and selecting a predetermined number of most-prominent frequency bands in the current-demand curve obtained at step 406 within a frequency range of interest; (ii) multiplying an amplitude of each selected frequency band by the corresponding impedance value from the spectral impedance profile obtained at step 402; and (iii) summing up the products of step (ii). In alternative embodiments, other suitable methods can similarly be used to obtain quantitative noise-level estimates based on the spectral impedance profile obtained at step 402 and the current-demand curve obtained at step 406.

Qualitative evaluation of the power-supply noise level may include inspection (e.g., visual) of the graphs similar to those shown in FIGS. 2A and 2B/2C to determine the spectral positions of one or more most-prominent frequency bands in the current-demand curve obtained at step 406 with respect to the features of the spectral impedance profile obtained at step 402. Based on the inspection, a frequency-band position can be judged advantageous or disadvantageous. An example of an advantageous frequency-band position can be a position in which the spectral band in question is spectrally aligned with a relatively deep minimum or a null in the spectral impedance profile. Another example of an advantageous frequency-band position can be a position in which the spectral band in question corresponds to an impedance value in the spectral impedance profile that is smaller than a predetermined threshold value. The threshold value can be expressed in absolute units (e.g., Ohms) or in relative units (e.g., %) with respect to the maximum impedance value in the spectral impedance profile. Examples of disadvantageous frequency-band positions include, but are not limited to (i) a position in which the spectral band in question is spectrally aligned with a local or global maximum in the spectral impedance profile and (ii) a position in which the spectral band in question corresponds to an impedance value that is greater than a predetermined threshold value.

Step 410 serves to direct the processing of method 400 back to step 404 or forward to step 412. More specifically, the processing of method 400 is directed back to step 404 if there is an additional configuration value that needs to be processed. If there is no such value, then the processing of method 400 is directed to step 412.

At step 412, the evaluations of the power-supply noise level corresponding to all previously processed configuration values are compared to select one or more configuration values that enable the circuit to meet certain performance specifications and/or to have an acceptably low power-supply noise level during operation. In various embodiments, different sets of quantitative and qualitative criteria can be used to make the selection. For example, each configuration value selected at step 412 may have one or more of the following characteristics: (i) it corresponds to a relatively low estimated power-supply noise level; (ii) it results in relatively many advantageous frequency-band positions in the current-demand curve; and (iii) it results in relatively few disadvantageous frequency-band positions in the current-demand curve.

At step 414, one of the configuration values selected at step 412 is used to program the programmable clock spreader in the integrated circuit, e.g., by writing that configuration value into the pertinent configuration register, such as configuration register 330 (FIG. 3).

While this invention has been described with reference to illustrative embodiments, this description is not intended to be construed in a limiting sense.

Although spectral impedance profiles and current-demand characteristics of an integrated circuit have been described as being presented in graphical form (as shown in FIGS. 2A-2C), other suitable forms of presenting these quantities, including machine-readable data files, can similarly be used in various embodiments of the invention.

Various modifications of the described embodiments, as well as other embodiments, which are apparent to persons skilled in the art to which the invention pertains are deemed to lie within the scope of the invention as expressed in the following claims.

Embodiments of the invention may be implemented as circuit-based processes, including possible implementation on a single integrated circuit.

Embodiments of the invention can be in the form of methods and apparatuses for practicing those methods. Some embodiments of the invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of various embodiments may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Examples of integrated circuits in which various embodiments of the invention can be practiced include, without limitation, digital signal processor (DSP) hardware, application specific integrated circuits (ASICs), field programmable gate arrays (FPGAs), and memory circuits (e.g., ROMs and RAMs). Other types of circuits, conventional and/or custom, are also intended to be covered.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Although embodiments of the invention have been described herein with reference to the accompanying drawings, it is to be understood that embodiments of the invention are not limited to the described embodiments, and one of ordinary skill in the art will be able to contemplate various other embodiments of the invention within the scope of the following claims.

What is claimed is:

1. An integrated circuit, comprising:
   a plurality of clock regions, each configured to receive a respective clock signal from a first plurality of clock signals and having circuitry that is triggered by the respective clock signal from the first plurality of clock signals; and
   a programmable clock spreader configured to generate the first plurality of clock signals, the programmable clock spreader including:
      a shift register configured to generate a second plurality of clock signals, each corresponding to a different respective phase of a master-clock signal, wherein the shift register is clocked by a reference-clock signal having a frequency that is higher than a frequency of the master-clock signal; and
      a plurality of signal selectors, each configured to receive at least a subset of the second plurality of clock signals from said shift register and apply a selected one of said received clock signals of the second plurality to a corresponding clock region of the plurality of clock regions as the respective clock signal, wherein each signal selector of the plurality of signal selectors is programmable to select any one of said received clock signals of the second plurality for application to the corresponding clock region;
   wherein the programmable clock spreader has been programmed to cause a dominant frequency band of a current-demand curve exhibited by the integrated circuit to be at a spectral location having one or both of the following characteristics:
      said spectral location corresponds to a null or a minimum of a spectral impedance profile of the integrated circuit; and
      said spectral location corresponds to an impedance value in the spectral impedance profile of the integrated circuit that does not exceed 40% of a maximum impedance value in the spectral impedance profile.

2. The integrated circuit of claim 1, wherein the programmable clock spreader further comprises a configuration register configured to store a configuration value that programs the plurality of signal selectors to make corresponding clock signal selections.

3. The integrated circuit of claim 2, wherein the programmable clock spreader further comprises circuit means for changing the configuration value stored in the configuration register.

4. The integrated circuit of claim 1, wherein the plurality of signal selectors have been programmed so that said spectral location corresponds to a null or a minimum of the spectral impedance profile of the integrated circuit; and
   wherein the plurality of signal selectors have been programmed so that said spectral location also corresponds to an impedance value in the spectral impedance profile of the integrated circuit that does not exceed 40% of the maximum impedance value in the spectral impedance profile.

5. The integrated circuit of claim 1, wherein
   the second plurality of clock signals consists of K clock signals corresponding to K different phases of the master-clock signal, where K is an integer greater than four;

and the plurality of signal selectors consists of L signal selectors, where L is a positive integer that is smaller than K.

6. A method of clock spreading, comprising:
(A) obtaining, with a machine, a spectral impedance profile corresponding to an integrated circuit, wherein the integrated circuit comprises:
a programmable clock spreader configured to generate a first plurality of clock signals based on a master clock signal and in accordance with a programmed configuration; and
a plurality of clock regions, each configured to receive a respective clock signal of the first plurality of clock signals from the programmable clock spreader and having circuitry that is configured to be triggered off the respective clock signal; and
(B) identifying, with the machine, a configuration to be programmed into the programmable clock spreader based on the spectral impedance profile, wherein the identifying is performed by:
(B1) selecting a possible configuration for the programmable clock spreader;
(B2) obtaining a current-demand characteristic of the integrated circuit corresponding to the possible configuration selected at step (B1);
(B3) evaluating power-supply noise corresponding to the possible configuration selected at step (B1) based on the spectral impedance profile obtained at step (A) and the current-demand characteristic obtained at step (B2);
(B4) performing steps (B1)-(B3) for each configuration from a plurality of possible configurations of the programmable clock spreader; and
(B5) selecting, from the plurality of possible configurations, the configuration to be programmed into the programmable clock spreader based on evaluation results obtained in different instances of step (B3).

7. The method of claim 6, further comprising:
(C) programming the configuration identified at step (B) into the programmable clock spreader of the integrated circuit.

8. The integrated circuit that has been programmed using the method of claim 7.

9. The method of claim 6, wherein step (B2) comprises running a computer-based simulation to generate the current-demand characteristic corresponding to the possible configuration selected at step (B1).

10. The method of claim 6, wherein step (B3) comprises:
(B3a) selecting a predetermined number of frequency bands in the current-demand curve obtained at step (B2);
(B3b) multiplying an amplitude of each frequency band selected at step (B3a) by a corresponding impedance value from the spectral impedance profile obtained at step (A); and
(B3c) determining a sum of the multiplication products generated at step (B3b).

11. The method of claim 6, wherein step (B) comprises identifying the configuration to be programmed into the programmable clock spreader in a manner that causes a dominant frequency band of a corresponding current-demand curve exhibited by the integrated circuit to be at a spectral location corresponding to a null or a minimum of the spectral impedance profile obtained at step (A).

12. The method of claim 6, wherein step (B) comprises identifying the configuration to be programmed into the programmable clock spreader in a manner that causes a dominant frequency band of a corresponding current-demand curve exhibited by the integrated circuit to be at a spectral location corresponding to an impedance value in the spectral impedance profile obtained at step (A) that does not exceed 40% of a maximum impedance value in the spectral impedance profile.

13. The method of claim 6, wherein step (A) comprises running a computer-based simulation to generate the spectral impedance profile.

14. The method of claim 6, wherein step (A) comprises measuring the spectral impedance profile of the integrated circuit using a circuit tester.

15. The method of claim 6, wherein the programmable clock spreader comprises:
circuit means for generating a second plurality of clock signals, each corresponding to a different respective phase of the master-clock signal; and
a plurality of signal selectors, each configured to receive at least a subset of the second plurality of clock signals from said circuit means and apply a selected one of said received clock signals of the second plurality to a corresponding clock region of the plurality of clock regions as the respective clock signal, wherein each signal selector of the plurality of signal selectors is programmable to select any one of said received clock signals of the second plurality for application to the corresponding clock region.

16. The method of claim 15, wherein the second plurality of clock signals consists of K clock signals corresponding to K different phases of the master-clock signal, where K is an integer greater than four; and
the plurality of signal selectors consists of L signal selectors, where L is a positive integer that is smaller than K.

17. A non-transitory machine-readable medium, having encoded thereon program code, wherein, when the program code is executed by a machine, the machine implements a method of clock spreading, the method comprising:
(A) obtaining a spectral impedance profile corresponding to an integrated circuit, wherein the integrated circuit comprises:
a programmable clock spreader configured to generate a first plurality of clock signals based on a master-clock signal and in accordance with a programmed configuration; and
a plurality of clock regions, each configured to receive a respective clock signal of the first plurality of clock signals from the programmable clock spreader and having circuitry that is configured to be triggered off the respective clock signal; and
(B) identifying a configuration to be programmed into the programmable clock spreader based on the spectral impedance profile;
wherein when programmed, the programmable clock spreader causes a dominant frequency band of a current-demand curve exhibited by the integrated circuit to be at a spectral location having the following characteristics:
said spectral location corresponds to a null or a minimum of a spectral impedance profile of the integrated circuit; and
said spectral location corresponds to an impedance value in the spectral impedance profile of the integrated circuit that does not exceed 40% of a maximum impedance value in the spectral impedance profile.

18. The non-transitory machine-readable medium of claim 17, wherein a shift register located in the programmable clock spreader receives a reference-clock signal having a frequency that is higher than a frequency of the master-clock signal.

19. The non-transitory machine-readable medium of claim 17, wherein a configuration register located in the programmable clock spreader stores a configuration value that directs a plurality of signal selectors to make corresponding clock signal selections.

20. The non-transitory machine-readable medium of claim 19, wherein the plurality of signal selectors have been programmed so that said spectral location corresponds to an impedance value in the spectral impedance profile of the integrated circuit that does not exceed 40% of the maximum impedance value in the spectral impedance profile.

* * * * *